United States Patent
Chien et al.

(10) Patent No.: US 10,643,529 B1
(45) Date of Patent: May 5, 2020

(54) METHOD FOR COMPENSATION BRIGHTNESS NON-UNIFORMITY OF A DISPLAY PANEL, AND ASSOCIATED DISPLAY DEVICE

(71) Applicant: HIMAX TECHNOLOGIES LIMITED, Tainan (TW)

(72) Inventors: Chao-Liang Chien, Tainan (TW); Meng-Wei Shen, Tainan (TW)

(73) Assignee: HIMAX TECHNOLOGIES LIMITED, Tainan (TW)

(*) Notice: Subject to any disclaimer, the term of this patent is extended or adjusted under 35 U.S.C. 154(b) by 0 days.

(21) Appl. No.: 16/224,714

(22) Filed: Dec. 18, 2018

(51) Int. Cl.
*G09G 3/32* (2016.01)
*G09G 3/3225* (2016.01)
*G09G 3/3291* (2016.01)
*H01L 27/32* (2006.01)

(52) U.S. Cl.
CPC ......... *G09G 3/3225* (2013.01); *G09G 3/3291* (2013.01); *H01L 27/3276* (2013.01); *G09G 2310/08* (2013.01); *G09G 2320/0233* (2013.01); *G09G 2330/028* (2013.01)

(58) Field of Classification Search
CPC ...... G09G 3/32; G09G 3/3208; G09G 3/3225; G09G 3/3258; G09G 3/3283; G09G 3/3291; G09G 3/342; G09G 2300/0819; G09G 2310/027; G09G 2310/0291; G09G 2320/0233; G09G 2320/0285; G09G 2320/0646; G09G 2320/0673; G09G 2330/00; G09G 2330/028; H01L 27/3276
See application file for complete search history.

(56) References Cited

U.S. PATENT DOCUMENTS

| | | | | |
|---|---|---|---|---|
| 2001/0024178 A1* | 9/2001 | Takeuchi | ............. | G09G 3/3406 345/55 |
| 2001/0041489 A1* | 11/2001 | Takeuchi | ............... | G02B 26/02 445/24 |
| 2006/0139283 A1* | 6/2006 | Daum | ................... | G09G 3/3659 345/98 |
| 2007/0279351 A1* | 12/2007 | Im | ........................ | G09G 3/3611 345/87 |
| 2008/0100542 A1* | 5/2008 | Miller | ................... | G09G 3/3258 345/77 |
| 2008/0204378 A1* | 8/2008 | Park | ...................... | G09G 3/3208 345/77 |
| 2009/0108744 A1* | 4/2009 | Park | ...................... | G09G 3/2011 313/504 |
| 2009/0135128 A1* | 5/2009 | Jeon | ........................ | G09G 3/342 345/102 |

(Continued)

*Primary Examiner* — Michael J Eurice
(74) *Attorney, Agent, or Firm* — Winston Hsu

(57) ABSTRACT

A method for compensating brightness non-uniformity of a display panel, and associated display device is provided. The display panel may include a plurality of display blocks, each of the plurality of display blocks may includes one or more display units, and the method includes: according to a control signal, selecting a voltage detection terminal of a display block within the plurality of display blocks, wherein the control signal carries information indicating the display block; according to a voltage level of the voltage detection terminal, generating a plurality of reference voltages; and based on the plurality of reference voltages, driving a display voltage to a display unit within the display block according to a set of display data.

8 Claims, 5 Drawing Sheets

(56) References Cited

U.S. PATENT DOCUMENTS

| | | | |
|---|---|---|---|
| 2010/0123741 A1* | 5/2010 | Shin | G09G 3/3426 345/690 |
| 2010/0149086 A1* | 6/2010 | Choi | G09G 3/3426 345/102 |
| 2010/0156955 A1* | 6/2010 | Kimura | G09G 3/3426 345/690 |
| 2011/0018571 A1* | 1/2011 | Kim | G02F 1/1345 324/760.02 |
| 2011/0062874 A1* | 3/2011 | Knapp | H04L 12/43 315/158 |
| 2011/0210678 A1* | 9/2011 | Grajcar | H05B 33/0809 315/192 |
| 2011/0273427 A1* | 11/2011 | Park | G09G 3/3225 345/212 |
| 2011/0279749 A1* | 11/2011 | Erinjippurath | G09G 3/3426 349/61 |
| 2012/0001946 A1* | 1/2012 | Cho | G09G 3/3426 345/690 |
| 2012/0319601 A1* | 12/2012 | Ye | H05B 33/0815 315/192 |
| 2013/0002639 A1* | 1/2013 | Park | G09G 3/3225 345/212 |
| 2013/0106923 A1* | 5/2013 | Shields | G09G 3/3406 345/690 |
| 2013/0293594 A1* | 11/2013 | Kang | G09G 3/3406 345/690 |
| 2013/0321483 A1* | 12/2013 | You | G09G 5/10 345/690 |
| 2013/0335682 A1* | 12/2013 | Gilbert | G09G 3/3426 349/85 |
| 2014/0078194 A1* | 3/2014 | An | G09G 3/003 345/691 |
| 2014/0118417 A1* | 5/2014 | Kang | G09G 5/10 345/690 |
| 2015/0091795 A1* | 4/2015 | Kang | G06F 3/011 345/156 |
| 2015/0187321 A1* | 7/2015 | Kim | G09G 3/3696 345/87 |
| 2016/0049111 A1* | 2/2016 | Lee | G09G 3/3291 345/691 |
| 2016/0055831 A1 | 2/2016 | Kim | |
| 2016/0117986 A1* | 4/2016 | Wang | G09G 3/3258 345/212 |
| 2016/0195772 A1* | 7/2016 | Lee | G02F 1/133611 349/61 |
| 2017/0193905 A1 | 7/2017 | Meng | |
| 2017/0325307 A1* | 11/2017 | Lee | H05B 33/083 |
| 2018/0033374 A1 | 2/2018 | Jeong | |
| 2018/0061341 A1* | 3/2018 | Kang | G09G 3/3685 |
| 2018/0068612 A1 | 3/2018 | Cho | |
| 2018/0075798 A1* | 3/2018 | Nho | G09G 3/32 |
| 2018/0122364 A1* | 5/2018 | Lim | G09G 3/3258 |
| 2018/0144689 A1* | 5/2018 | Hong | G09G 3/3233 |
| 2019/0005890 A1* | 1/2019 | Lim | G09G 3/3611 |
| 2019/0287469 A1* | 9/2019 | Park | G09G 3/342 |
| 2019/0304362 A1* | 10/2019 | Yuan | G09G 3/3266 |
| 2019/0340981 A1* | 11/2019 | Pyo | G09G 3/2007 |

* cited by examiner

METHOD FOR COMPENSATION BRIGHTNESS NON-UNIFORMITY OF A DISPLAY PANEL, AND ASSOCIATED DISPLAY DEVICE

BACKGROUND OF THE INVENTION

1. Field of the Invention

The present invention is related to display devices, and more particularly, to a method for compensating brightness non-uniformity of a display panel, and associated display device.

2. Description of the Prior Art

In order to provide all display units with power, long wires may be needed for transmitting supply voltages to display units that are far from a power supply circuit. However, the material for implementing these wires is not an ideal conductor, and voltage drops may be introduced, which may affect brightness of the display units. More particularly, brightness of display units on different locations may be different. As a result, there is a need for a novel method and associated display device, to compensate brightness non-uniformity of a display panel.

SUMMARY OF THE INVENTION

An objective of the present invention is to provide a method for compensating brightness non-uniformity of a display panel, and associated display device, to enhance overall performance of the display panel.

Another objective of the present invention is to provide a method for compensating brightness non-uniformity of a display panel, and associated display device, to solve the related art problems without introducing unwanted side effects, or in a way that is less likely to introduce a side effect.

At least one embodiment of the present invention provides a method for compensating brightness non-uniformity of a display panel. The display panel may comprise a plurality of display blocks, and each of the plurality of display blocks may comprise one or more display units. The method comprises: according to a control signal, selecting a voltage detection terminal of a display block within the plurality of display blocks, wherein the control signal carries information indicating the display block; according to a voltage level of the voltage detection terminal, generating a plurality of reference voltages; and based on the plurality of reference voltages, driving a display voltage to a display unit within the display block according to a set of display data.

At least one embodiment of the present invention provides a display device. The display device may comprise a display panel, a selection circuit, a voltage generator, one or more source drivers and a controller. The display panel is arranged to display an image, wherein the display panel may comprise a plurality of display blocks, and each of the plurality of display blocks may comprise one or more display units. The selection circuit is coupled to the plurality of display blocks, and the selection circuit is arranged to select a voltage detection terminal of a display block within the plurality of display blocks according to a control signal, for example, the control signal may carries information indicating the display block. The voltage generator is coupled to the selection circuit, and the voltage generator is arranged to generate a plurality of reference voltages according to a voltage level of the voltage detection terminal. The one or more source drivers are coupled to the display panel and the voltage generator, and the one or more source drivers are arranged to drive display voltages to the display panel based on the plurality of reference voltages, wherein a source driver within the one or more source drivers may drive a display voltage to a display unit within the display block according to a set of display data. The controller is coupled to the selection circuit and the one or more source drivers, and the controller is arranged to control operations of the selection circuit and the one or more source drivers, for example, the controller may generate the control signal.

One of various advantages of the present invention is that the present invention can make the brightness of display units on different locations be uniform through adjusting the reference voltages according to detected voltage levels of supply voltages of corresponding blocks. In addition, implementing according to embodiments of the present invention will not greatly increase associated costs. Thus, the present invention can solve the related art problems without introducing unwanted side effects, or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
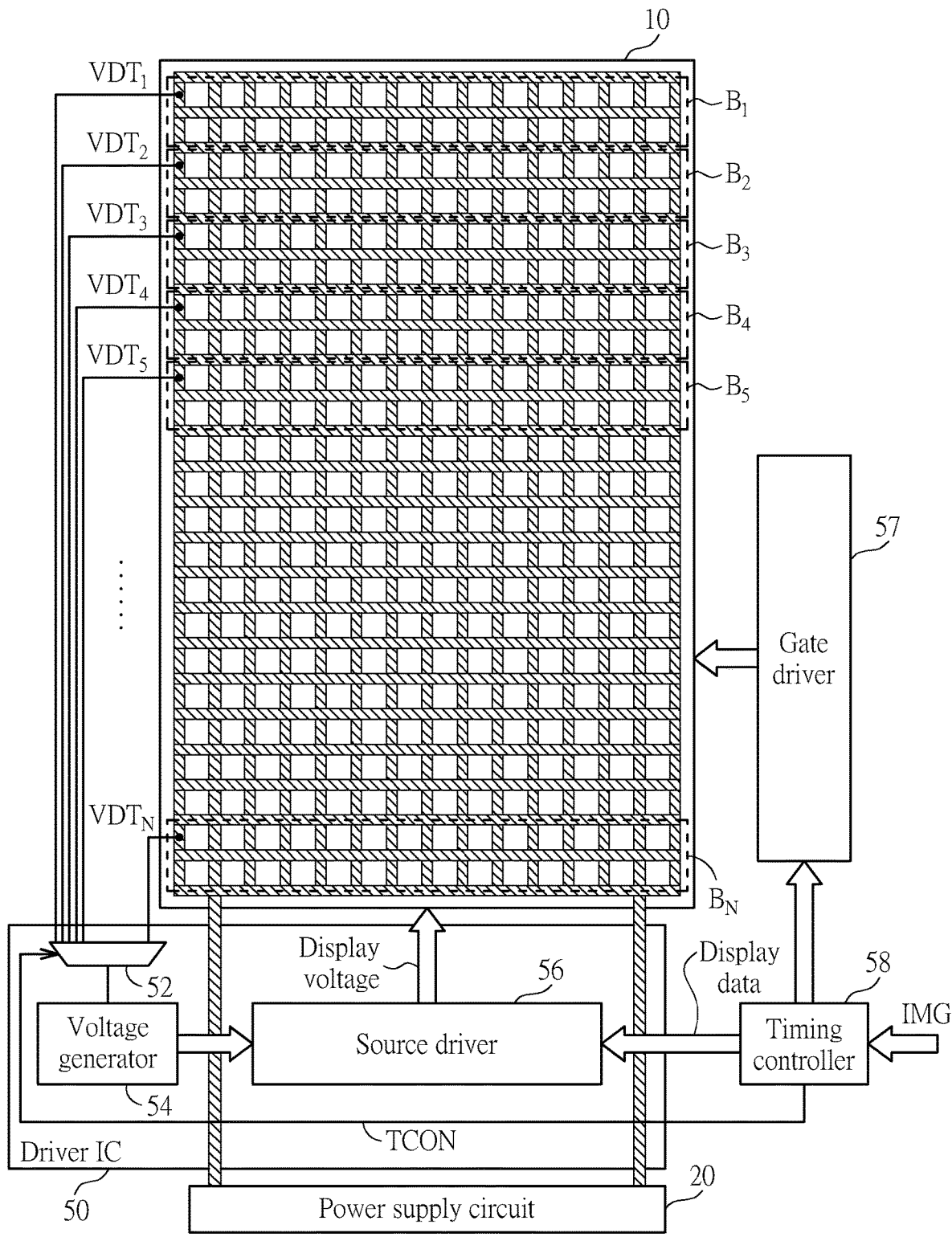
FIG. 1 is a diagram illustrating a display device according to an embodiment of the present invention.

FIG. 1 is a diagram illustrating a display device 100 according to an embodiment of the present invention. The display device 100 may comprise a display panel 10 (e.g. an active-matrix organic light-emitting diode (AMOLED) panel), a power supply circuit 20, a controller such as a timing controller 58, at least one driver integrated circuit (IC) (e.g. one or more driver ICs) such as a driver IC 50, and one or more gate drivers such as a gate driver 57, where the driver IC 50 may comprise a selection circuit 52, a voltage generator 54 (e.g. a gamma voltage generator), and one or more source drivers such as a source driver 56, and the source driver 56 may comprise one or more driver circuits, but the present invention is not limited thereto. For example, at least one portion (e.g. one or more portions or all) of the display device 100, such as one or more of the power supply circuit 20 and the driver IC 50, such as the selection circuit 52, the voltage generator 54, the source driver 56 and the timing controller 58 therein, may be arranged in a single die, or for another example, in separated packages, but the present invention is not limited thereto.

In this embodiment, the display panel 10 may comprise a plurality of display blocks $\{B_1, B_2, B_3, B_4, B_5, \ldots, B_N\}$, and each of the plurality of display blocks $\{B_1, B_2, B_3, B_4, B_5, \ldots, B_N\}$ may comprise one or more display units (not shown), where N is a positive integer. For better comprehension, each of the plurality of display blocks $\{B_1, B_2, B_3, B_4, B_5, \ldots, B_N\}$ may comprise one or more rows of display units, but the present invention is not limited thereto. For example, all display units within the display panel 10 may be divided into N display blocks (i.e. the plurality of display blocks $\{B_1, B_2, B_3, B_4, B_5, \ldots, B_N\}$), and more particularly, power wires (indicated by shading) laid in the display panel 10 for providing all display units with power are also divided into N portions as shown in FIG. 1. Note that, a number of power wires shown in FIG. 1 is for illustrative purpose only, and is not a limitation of the present invention. In addition, the selection circuit 52 is coupled to the plurality of display blocks $\{B_1, B_2, B_3, B_4, B_5, \ldots, B_N\}$, and more particularly, the selection circuit 52 is coupled to voltage detection terminals $\{VDT_1, VDT_2, VDT_3, VDT_4, VDT_5, \ldots, VDT_N\}$ of the plurality of display blocks $\{B_1, B_2, B_3, B_4, B_5, \ldots, B_N\}$, where the voltage detection terminals $\{VDT_1, VDT_2, VDT_3, VDT_4, VDT_5, \ldots, VDT_N\}$ are coupled to power wire segments within the plurality of display blocks $\{B_1, B_2, B_3, B_4, B_5, \ldots, B_N\}$, respectively. Therefore, a voltage level of a voltage detection terminal $VDT_n$ (e.g. the subscript "n" may be a positive integer within the interval [1, N]) within the voltage detection terminals $\{VDT_1, VDT_2, VDT_3, VDT_4, VDT_5, \ldots, VDT_N\}$ may indicate a voltage level of a supply voltage within any display unit of one or more rows of display units corresponding to the voltage detection terminal $VDT_n$, such as voltage levels of respective supply voltage levels of the display units of the corresponding display block $B_n$ within the plurality of display blocks $\{B_1, B_2, B_3, B_4, B_5, \ldots, B_N\}$), but the present invention is not limited thereto.

The voltage generator 54 is coupled to the selection circuit 52, and the source driver 56 is coupled to the display panel 10 and the voltage generator 54. The timing controller 58 is coupled to the selection circuit 52, the source driver 56 and the gate driver 57, where the timing controller 58 may control operations of the selection circuit 52, the source driver 56 and the gate driver 57. In this embodiment, the timing controller 58 may control operations of the display panel 10 through the gate driver 57, but the present invention is not limited thereto. The power supply circuit 20 is coupled to the display panel 10 through power wires, and the power supply circuit 20 may provide the display panel 10 (e.g. a portion or all of the display units within the display panel 10) with power, but the present invention is not limited thereto.

Figure 2:
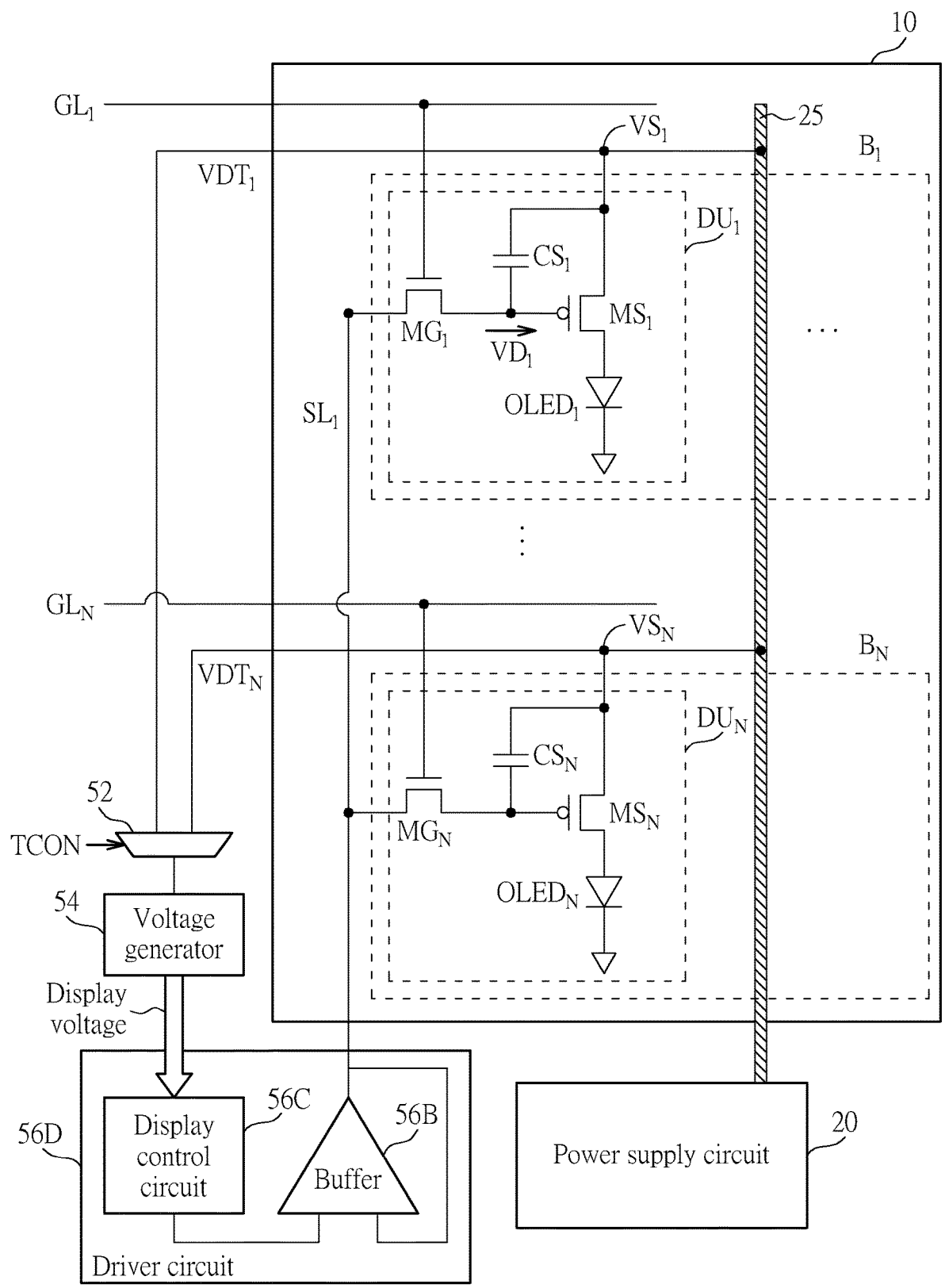
FIG. 2 is a circuit diagram illustrating operations of display units within a display panel according to an embodiment of the present invention.

FIG. 2 is a circuit diagram illustrating operations of display units $\{DU_1, \ldots, DU_N\}$ within the display panel 10 according to an embodiment of the present invention. Referring to FIG. 2 in conjunction with FIG. 1, the display units $DU_1$ and $DU_N$ may be regarded as display units within the display blocks $B_1$ and $B_N$, respectively, for example, the display unit $DU_1$ may represent a display unit that is far from the power supply circuit 20, and the display unit $DU_N$ may represent a display unit near the power supply circuit 20. In this embodiment, each of the display units $\{DU_1, \ldots, DU_N\}$ may comprise a plurality of transistors, a capacitor and an organic light-emitting diode (OLED). The display unit $DU_1$ may comprise a supply voltage terminal $VS_1$, transistors $MG_1$ and $MS_1$, a capacitor $CS_1$, and an OLED $OLED_1$. In this embodiment, the transistor is coupled between a source line $SL_1$ and a gate terminal of the transistor $MS_1$, where a gate terminal of the transistor $MG_1$ is coupled to a gate line $GL_1$. A source terminal and a drain terminal of the transistor $MS_1$ are coupled to the supply voltage terminal $VS_1$ and the OLED $OLED_1$, respectively, where the supply voltage terminal $VS_1$ is coupled to a power wire 25. The capacitor $CS_1$ is coupled between the gate terminal and the source terminal of the transistor $MS_1$. The display unit $DU_N$ may comprise a supply voltage terminal $VS_N$, transistors $MG_N$ and $MS_N$, a capacitor $CS_N$, and an OLED $OLED_N$. As the architecture of the display unit $DU_N$ is similar to that of the display unit $DU_1$, similar descriptions are omitted, for brevity. Note that, gate lines $\{GL_1, \ldots, GL_N\}$ may be coupled to the gate drivers 57 (not shown in FIG. 2, for brevity), in order to allow the timing controller 58 to control operations of the display panel 10 through the gate driver 57 and the gate lines $\{GL_1, \ldots, GL_N\}$, but the present invention is not limited thereto. In addition, the driver circuit 56D within the one or more driver circuit of the source driver 56 shown in FIG. 1 may comprise a display control circuit 56C and a buffer 56B (e.g. a buffer circuit with an operational amplifier (OPAMP) therein), where the display control circuit 56C is couple to the voltage generator 54, and the buffer 56B is coupled to the display control circuit 56C and a source line such as the source line $SL_1$, but the present invention is not limited thereto.

Taking the display unit $DU_1$ as an example, brightness of the display unit $DU_1$ is determined by a current passing through the OLED $OLDE_1$, where the current is controlled by the transistor $MS_1$ according to a voltage difference between the gate terminal and the source terminal of the transistor $MS_1$ (i.e. a voltage difference stored by the capacitor $CS_1$). That is, the brightness of the display unit $DU_1$ (e.g. the OLED $OLED_1$) is determined according to a voltage difference between a supply voltage on the supply voltage terminal $VS_1$ and the display voltage $VD_1$ on the gate terminal of the transistor MS1 (e.g.

a difference between a voltage level of the supply voltage on the supply voltage terminal $VS_1$ and a voltage level of the display voltage $VD_1$), and associated descriptions regarding brightness of the rest of the aforementioned all display units within the display panel 10 may be deduced by analogy, and therefore are omitted, for brevity.

Referring to FIGS. 1 and 2, and taking an image IMG as an example, when the timing controller 58 controls the source driver 56 to drive display voltages to the display units within the display block $B_1$, the selection circuit 52 may select the voltage detection terminal $VDT_1$ of the display block $B_1$ within the plurality of display blocks $\{B_1, B_2, B_3, B_4, B_5, \ldots, B_N\}$ according to the control signal TCON (e.g. a state $STATE_1$ of the control signal TCON), where the control signal TCON, for example, the state $STATE_1$, may carry information indicating the display block $B_1$. The voltage generator 54 may generate a plurality of reference voltages (e.g. reference voltages $\{VR1\_1, VR2\_1, \ldots, VR256\_1\}$) according to a voltage level of the voltage detection terminal $VDT_1$, where the plurality of reference voltages correspond to a plurality of channel level values (e.g. grey level values), respectively, for example, 256 reference voltages respectively correspond to 256 channel level values regarding a 8-bit image pixel unit. Note that, the voltage level of the voltage detection terminal $VDT_1$ is determined according to a distance on a connection path between the display block $B_1$ (or the display unit $DU_1$) and the power supply circuit 20 (i.e. a distance of the power transmission path on a power wire such as the power wire 25), but the present invention is not limited thereto. The source driver 56 may drive display voltages to display units within the display block $B_1$ based on the reference voltages $\{VR1\_1, VR2\_1, \ldots, VR256\_1\}$, for example, a source driver such as the driver circuit 56D may drive a display voltage $VD_1$ to the display unit $DU_1$ within the display block $B_1$ according to a set of display data $DDATA_1$, for example, a display control circuit 56C may select a specific reference voltage within the reference voltages {VR1_1, VR2_1, ..., VR256_1} according to the set of display data $DDATA_1$, and the buffer 56B may transmit this specific reference voltage to the display unit $DU_1$ as the display voltage $VD_1$. As a result, the driver circuit 56D may generate the display voltage $VD_1$ on the gate terminal of the transistor $MS_1$ according to the set of display data $DDATA_1$, but the present invention is not limited thereto.

Similarly, when the timing controller 58 controls the source driver 56 to drive display voltages to the display units within the display block $B_N$, the selection circuit 52 may select the voltage detection terminal $VDT_N$ of the display block $B_N$ within the plurality of display blocks {$B_1$, $B_2$, $B_3$, $B_4$, $B_5$, ..., $B_N$} according to the control signal TCON (e.g. a state $STATE_N$ of the control signal TCON), where the control signal TCON, for example, the state $STATE_N$, may carry information indicating the display block $B_N$. The voltage generator 54 may generate a plurality of reference voltages (e.g. reference voltages {VR1_N, VR2_N, ..., VR256_N}) according to a voltage level of the voltage detection terminal $VDT_N$. Note that, the voltage level of the voltage detection terminal $VDT_N$ is determined according to a distance on a connection path between the display block $B_N$ (or the display unit $DU_N$) and the power supply circuit 20, but the present invention is not limited thereto. The source driver 56 may drive display voltages to display units within the display block $B_1$ based on the reference voltages {VR1_N, VR2_N, ..., VR256_N}, for example, the driver circuit 56D may drive a display voltage $VD_N$ to the display unit $DU_N$ within the display block $B_N$ according to a set of display data $DDATA_N$, for example, a display control circuit 56C may select a specific reference voltage within the reference voltages {VR1_N, VR2_N, ..., VR256_N} according to the set of display data $DDATA_1$, and the buffer 56B may transmit this specific reference voltage to the display unit $DU_N$ as the display voltage $VD_N$. As a result, the driver circuit 56D may generate the display voltage $VD_N$ on the gate terminal of the transistor $MS_N$ according to the set of display data $DDATA_N$, but the present invention is not limited thereto. Operations of driving unit pixels within the rest of the display blocks may be deduced by analogy, related descriptions are omitted, for brevity.

As shown in FIG. 2, the distance between the display unit $DU_1$ (which is positioned in the display block $B_1$ shown in FIG. 1) and the power supply circuit 20 is greater than the distance between the display unit $DU_N$ (which is positioned the display block $B_N$ shown in FIG. 1) and the power supply circuit 20. In addition, each segment within any power wire (such as the power wire 25 shown in FIG. 2) may have parasitic resistor(s) thereon. For example, there may be significant voltage drop(s) on this power wire, and the voltage level of the supply voltage on the supply voltage terminal $VS_1$ may be lower than the voltage level of the supply voltage on the supply voltage terminal $VS_N$.

Figure 3:
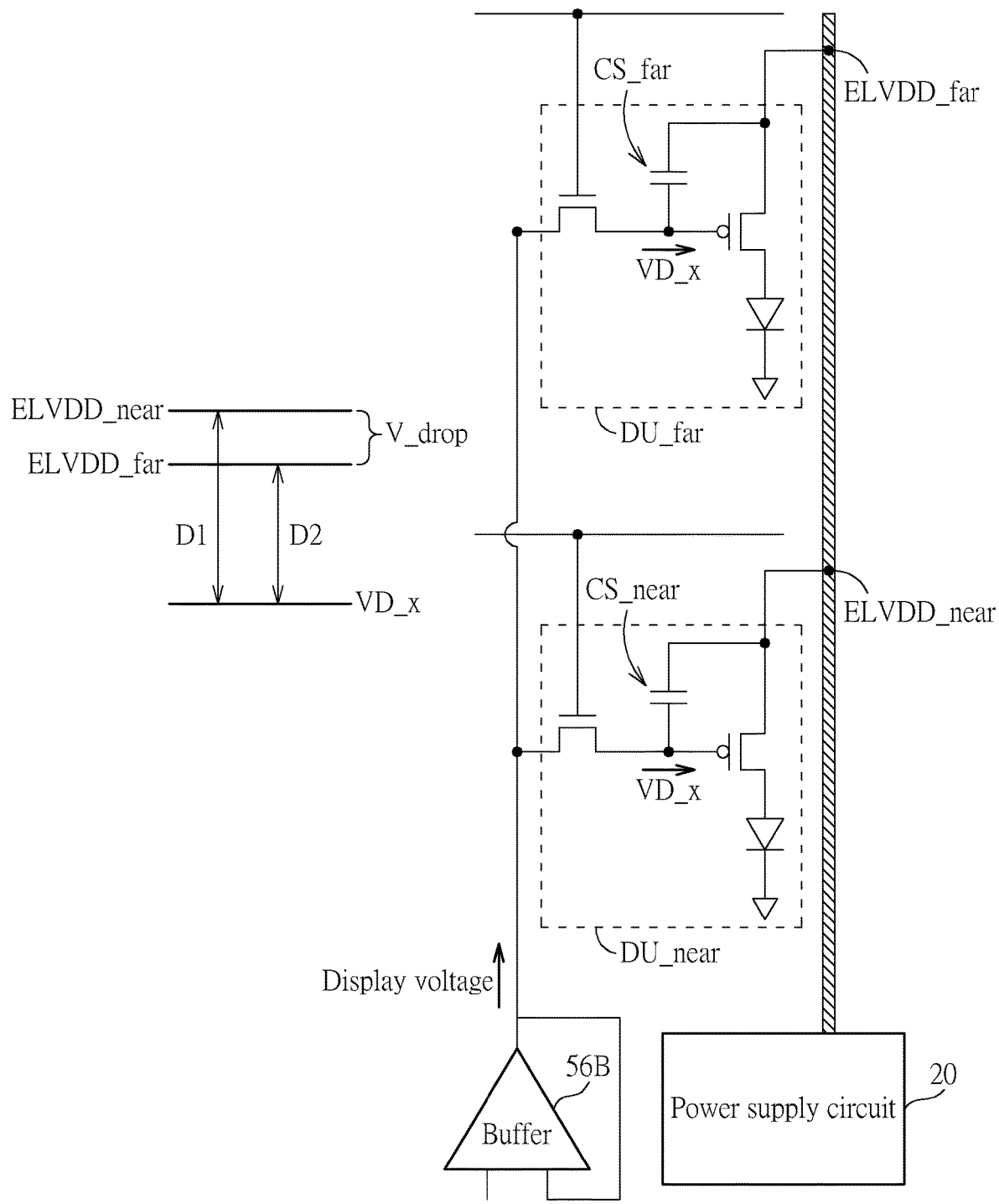
FIG. 3 illustrates a condition of fixed reference voltages being utilized in an embodiment of the present invention.
Figure 4:
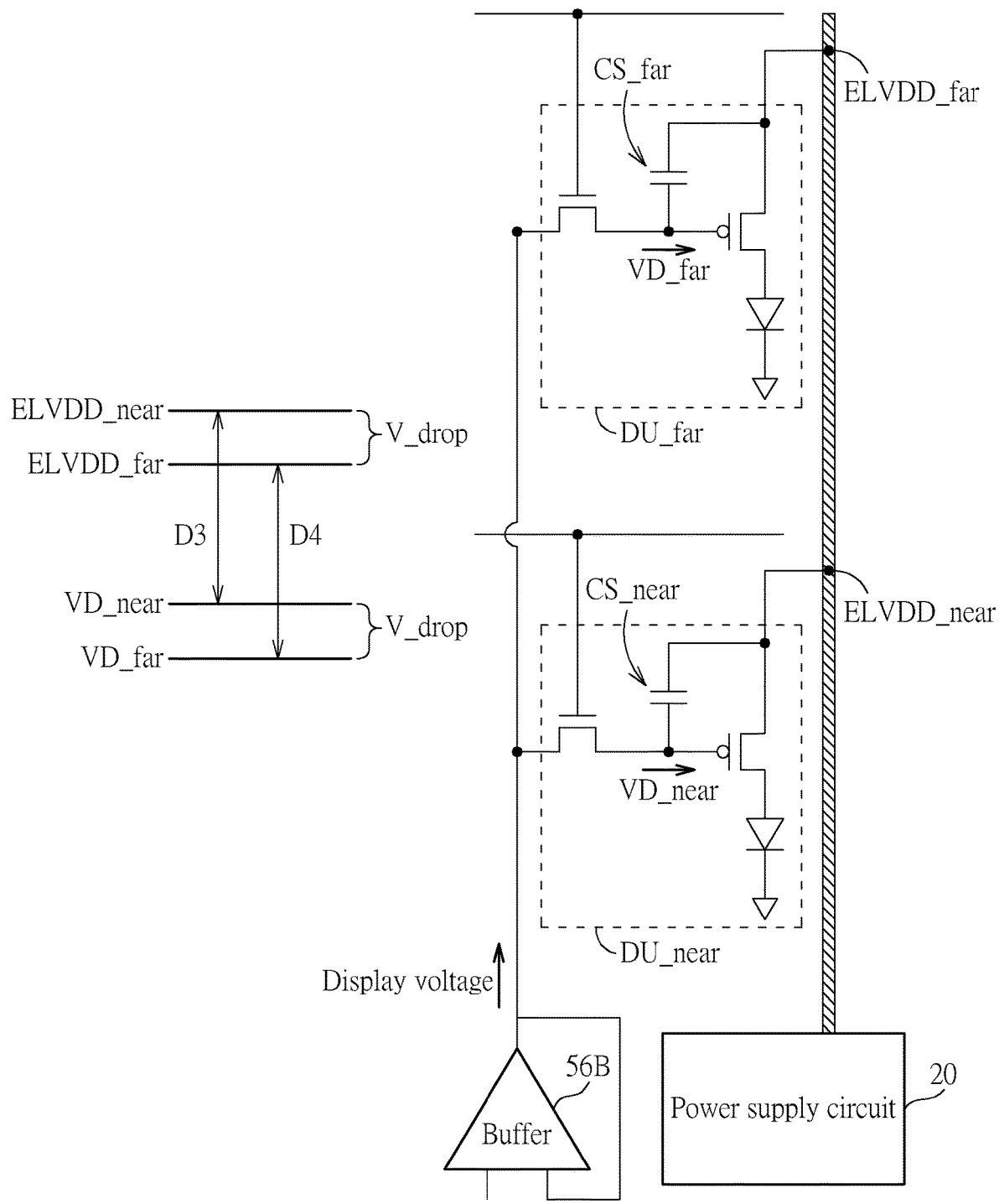
FIG. 4 illustrates a condition of dynamic reference voltages being utilized in an embodiment of the present invention.

For better comprehension, please refer to FIGS. 3 and 4, which illustrates conditions of fixed reference voltages and dynamic reference voltages being utilized in embodiments of the present invention, respectively. As shown in FIGS. 3 and 4, display unit DU_near may represent a display unit near the power supply circuit 20, for example, the display unit $DU_N$ shown in FIG. 2, and the display unit DU_far may represent a display unit that is far from the power supply circuit 20, for example, the display unit $DU_1$, but the present invention is not limited thereto. As mentioned above, brightness of display units DU_near and DU_far may be controlled or determined by voltage differences stored by capacitor CS_near and CS_far therein, respectively. In this embodiment, supply voltages ELVDD_near and ELVDD_far may represent supply voltages of the display units DU_near and DU_far, respectively.

For better comprehension, it is assumed that the display units DU_near and DU_far are displaying the same display data such as that of a white image in embodiments of FIGS. 3 and 4. Regarding the condition of utilizing fixed reference voltages shown in FIG. 3, a voltage difference V_drop between the supply voltage ELVDD_near and ELVDD_far may make a voltage difference D1 stored by the capacitor CS_near be greater than a voltage difference D2 stored by the capacitor CS_far since the buffer 56B drive the display units DU_near and DU_far by a same level of display voltage VD_x, and cause brightness non-uniformity (e.g. D1>D2), where the voltage differences D1 and D2 may indicate brightness of display units DU_near and DU_far in this condition, respectively. Regarding the condition of utilizing dynamic reference voltages shown in FIG. 4, where display voltages VD_near and VD_far are applied to the capacitors CS_near and CS_far, respectively, the voltage difference V_drop is also applied to a difference between the display voltages VD_near and VD_far by the voltage generator 54 shown in FIG. 2, and a voltage difference D3 stored by the capacitor CS_near may be equal to a voltage difference D4 stored by the capacitor CS_far. For example, the voltage generator 54 may generate the plurality of reference voltages (e.g. reference voltages {VR1_1, VR2_1, ..., VR256_1} or reference voltages {VR1_N, VR2_N, ..., VR256_N}) according to a voltage difference between a voltage detection terminal and at least one power terminal of the power supply circuit 20 (e.g. a difference between a voltage level of the voltage detection terminal and a voltage level of the aforementioned at least one power terminal of the power supply circuit 20), where the aforementioned at least one power terminal may be regarded as a supply voltage reference for the voltage generator 54, but the present invention is not limited thereto. As a result, the brightness non-uniformity can be compensated through dynamic reference voltages as shown in FIG. 4, and the brightness of the display unit DU_near and DU_far can be uniform (e.g. be identical for the same display data).

Figure 5:
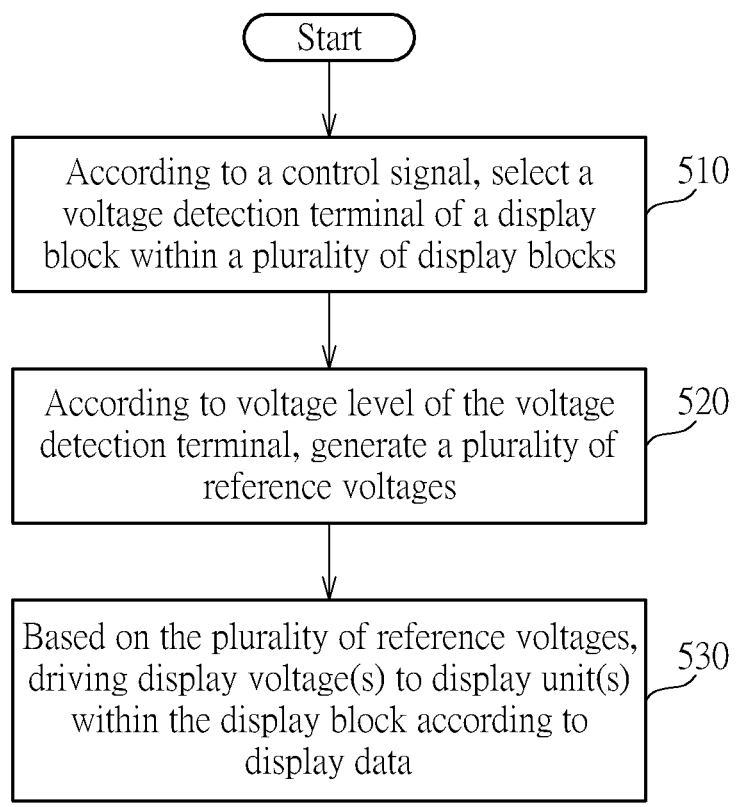
FIG. 5 is a flowchart illustrating a method for compensating brightness non-uniformity of the display panel.

FIG. 5 is a flowchart illustrating a method for compensating brightness non-uniformity of the display panel 10. For better comprehension, please refer to FIG. 5 in conjunction with FIGS. 1 and 2 in the following descriptions.

In Step 510, the selection circuit 52 may select a voltage detection terminal of a display block within the plurality of display blocks {$B_1$, $B_2$, $B_3$, $B_4$, $B_5$, ..., $B_N$} according to a control signal from the timing controller 58, for example, select the voltage detection terminal $VDT_1$ of the display block $B_1$ according to a first control signal that carries information indicating the display block $B_1$ (i.e. information indicating the source driver 56 is driving display unit (s) within the display block $B_1$ for corresponding display data).

In Step 520, the voltage generator 54 may generate a plurality of reference voltages that respectively corresponds to a plurality of channel level values according to a voltage level of the voltage detection terminal that is selected in Step 510, for example, the voltage detection terminal $VDT_1$.

In Step 530, based on the plurality of reference voltages that are generated in Step 520, the source driver 56 (e.g. the driver circuit 56D) may drive display voltage(s) to display unit(s) within the display block B1 according to at least one set of display data, for example, the source driver 56 may drive display voltages to display units within the display block according to corresponding sets of display data, respectively.

As mentioned above, all display units within the display panel 10 may be divided into N display blocks (i.e. the plurality of display blocks $\{B_1, B_2, B_3, B_4, B_5, \ldots, B_N\}$), and more particularly, power wires (indicated by shading) laid in the display panel 10 for providing all display units with power are also divided into N portions as shown in FIG. 1. It should be noted that the value of N is not a limitation of the present invention. The greater the value of N is, the finer division and better compensation grid can be achieved. Those skilled in the art should understand influence of the choice for the value of N after reading the above descriptions, and therefore related details are omitted, for brevity.

To summarize, the present invention method and associated display device can detect voltage levels of supply voltages of display blocks (e.g. display units therein) that are located at different locations on the display panel 10. The reference voltages corresponding to different channel levels values may be adjusted in response to difference between voltage levels of supply voltages of different display blocks. Therefore, each display voltage that transmitted toward the corresponding display unit can be adjusted in response to the voltage level of the supply voltage thereof, and the display panel 10 may display an image with uniform brightness. In addition, implementing according to embodiments of the present invention will not greatly increase associated costs, thus, the present invention can solve the related art problems without introducing unwanted side effects, or in a way that is less likely to introduce a side effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for compensating brightness non-uniformity of a display panel, wherein the display panel comprises a plurality of display blocks, each of the plurality of display blocks comprises one or more display units, and the method comprises:
   according to a control signal, selecting a voltage detection terminal of a display block within the plurality of display blocks, wherein the control signal carries information indicating the display block;
   according to a voltage level of the voltage detection terminal, generating a plurality of reference voltages; and
   based on the plurality of reference voltages, driving a display voltage to a display unit within the display block according to a set of display data;
   wherein the display unit comprises an organic light emitting diode (OLED), the voltage level of the voltage detection terminal indicates a voltage level of a supply voltage within the display unit, and brightness of the OLED is determined according to a voltage difference between the supply voltage and the display voltage.

2. The method of claim 1, wherein the plurality of reference voltages correspond to a plurality of channel level values, respectively.

3. A method for compensating brightness non-uniformity of a display panel, wherein the display panel comprises a plurality of display blocks, each of the plurality of display blocks comprises one or more display units, and the method comprises:
   according to a control signal, selecting a voltage detection terminal of a display block within the plurality of display blocks, wherein the control signal carries information indicating the display block;
   according to a voltage level of the voltage detection terminal, generating a plurality of reference voltages; and
   based on the plurality of reference voltages, driving a display voltage to a display unit within the display block according to a set of display data;
   wherein the display unit comprises an organic light emitting diode (OLED), and the voltage level of the voltage detection terminal is determined according to a distance on a connection path between the display block and a power supply circuit.

4. The method of claim 3, wherein the step of generating the plurality of reference voltages comprises:
   generating the plurality of reference voltages according to a voltage difference between the voltage detection terminal and at least one power terminal of the power supply circuit.

5. A display device, comprising:
   a display panel, arranged to display an image, wherein the display panel comprises a plurality of display blocks, and each of the plurality of display blocks comprises one or more display units;
   a selection circuit, coupled to the plurality of display blocks, arranged to select a voltage detection terminal of a display block within the plurality of display blocks according to a control signal, wherein the control signal carries information indicating the display block;
   a voltage generator, coupled to the selection circuit, arranged to generate a plurality of reference voltages according to a voltage level of the voltage detection terminal;
   one or more source drivers, coupled to the display panel and the voltage generator, arranged to drive display voltages to the display panel based on the plurality of reference voltages, wherein a source driver within the one or more source drivers drives a display voltage to a display unit within the display block according to a set of display data, and the display unit comprises an organic light emitting diode (OLED); and
   a controller, coupled to the selection circuit and the one or more source drivers, arranged to control operations of the selection circuit and the one or ore source drivers, and generate the control signal;
   a power supply circuit, coupled to the display panel, arranged to provide the display panel with power;
   wherein the voltage level of the voltage detection terminal indicates a voltage level of a supply voltage within the display unit, and brightness of the OLED is determined according to a voltage difference between the supply voltage and the display voltage.

6. The display device of claim 5, wherein the plurality of reference voltages correspond to a plurality of channel level values, respectively.

7. The display device of claim 5, wherein the voltage level of the voltage detection terminal is determined according to a distance on a connection path between the display block and the power supply circuit.

8. The display device of claim 7, wherein the voltage generator generates the plurality of reference voltages according to a voltage difference between the voltage detection terminal and at least one power terminal of the power supply circuit.

* * * * *